US010852349B2

(12) United States Patent
Liu et al.

(10) Patent No.: US 10,852,349 B2
(45) Date of Patent: Dec. 1, 2020

(54) WIRELESS TEST SYSTEM FOR TESTING MICROELECTRONIC DEVICES INTEGRATED WITH ANTENNA

(71) Applicant: MEDIATEK INC., Hsin-Chu (TW)

(72) Inventors: Chih-Yang Liu, Hsin-Chu (TW);
Ying-Chou Shih, Hsin-Chu (TW);
Yen-Ju Lu, Hsin-Chu (TW);
Chih-Ming Hung, San Jose, CA (US);
Jui-Lin Hsu, Hsin-Chu (TW)

(73) Assignee: MEDIATEK INC., Hsin-Chu (TW)

( * ) Notice: Subject to any disclaimer, the term of this patent is extended or adjusted under 35 U.S.C. 154(b) by 79 days.

(21) Appl. No.: 16/359,954

(22) Filed: Mar. 20, 2019

(65) Prior Publication Data
US 2019/0310314 A1 Oct. 10, 2019

Related U.S. Application Data

(60) Provisional application No. 62/654,605, filed on Apr. 9, 2018.

(51) Int. Cl.
G01R 31/30 (2006.01)
G01R 31/302 (2006.01)
G01R 31/28 (2006.01)
G01R 31/303 (2006.01)
H01Q 1/22 (2006.01)
G01R 1/04 (2006.01)

(52) U.S. Cl.
CPC ......... *G01R 31/3025* (2013.01); *G01R 1/045* (2013.01); *G01R 1/0408* (2013.01); *G01R 31/2822* (2013.01); *G01R 31/2863* (2013.01); *G01R 31/303* (2013.01); *H01Q 1/2283* (2013.01)

(58) Field of Classification Search
CPC ............ G01R 31/3025; G01R 31/2822; G01R 1/0408; G01R 1/045; G01R 31/2863; G01R 31/303; H01Q 1/2283; H04B 17/15; H04B 17/29
USPC ........................ 324/762.02, 762.01, 537, 500
See application file for complete search history.

(56) References Cited

U.S. PATENT DOCUMENTS 4,590,477 A * 5/1986 Regnier ................ G01S 13/785
342/173
6,703,852 B1 3/2004 Feltner
(Continued)

FOREIGN PATENT DOCUMENTS

CN 101932944 A 12/2010
WO 2017/062291 A1 4/2017

*Primary Examiner* — Giovanni Astacio-Oquendo
(74) *Attorney, Agent, or Firm* — Winston Hsu

(57) ABSTRACT

A wireless test system includes a load board having an upper surface and a lower surface. The load board has a testing antenna disposed on the load board. A socket for receiving a device under test (DUT) having an antenna structure therein is disposed on the upper surface of the load board. The antenna structure is aligned with the testing antenna. The wireless test system further includes a handler for picking up and delivering the DUT to the socket. The handler has a clamp for holding and pressing the DUT. The clamp is grounded during testing and functions as a ground reflector that reflects and reverses radiation pattern of the DUT from an upward direction to a downward direction toward the testing antenna.

24 Claims, 4 Drawing Sheets

(56) References Cited

U.S. PATENT DOCUMENTS

| | | | |
|---|---|---|---|
| 6,720,908 B1 * | 4/2004 | Puglia | G01S 13/44 |
| | | | 342/113 |
| 10,727,202 B2 * | 7/2020 | Lin | H01L 24/16 |
| 2009/0153158 A1 | 6/2009 | Dunn | |
| 2010/0283476 A1 | 11/2010 | Shen | |
| 2016/0025788 A1 | 1/2016 | Fujita | |
| 2017/0279491 A1 | 9/2017 | Lam | |
| 2018/0003754 A1 | 1/2018 | Schrattenecker | |

* cited by examiner

ID="1" />

WIRELESS TEST SYSTEM FOR TESTING MICROELECTRONIC DEVICES INTEGRATED WITH ANTENNA

CROSS REFERENCE TO RELATED APPLICATIONS

This application claims benefits from U.S. provisional application No. 62/654,605 filed Apr. 9, 2018, which is included herein in its entirety by reference.

BACKGROUND

The present disclosure relates to systems for over-the-air (OTA) testing of semiconductor devices in wireless communication devices such as millimeter-wave (mmW) based antenna-in-package (AiP) devices.

With the increased demand for mmW-based RF systems, there has been a corresponding interest in integrating these RF systems on silicon-based integrated circuits instead of using discrete III/V based semiconductor components. Millimeter-wave frequencies are generally defined to be between about 30 GHz and 300 GHz. Common applications for millimeter-wave base RF systems include, for example, automotive radar and high frequency communications systems.

Semiconductor devices that have undergone complicated processing are subjected to various types of electrical tests so as to test their characteristics and for defects thereof. The radio frequency (RF) of a microelectronic device such as a chip package integrated with RF transceiver circuitry is typically tested by using a RF automatic test equipment. For testing such a chip package with an integrated antenna or wireless device under test (DUT), a load board, which is conductively connected to the RF instrumentation circuitry, is typically used. The RF instrumentation circuitry is disposed under the load board. The load board may be coupled to a socket for receiving the chip package. A handler arm is used to pick and place the DUT onto the socket.

However, the final testing of the mmW-based AiP devices using conventional RF automatic test equipment is problematic. For example, the clamp of a handler arm of the conventional RF automatic test equipment may degrade or block the radiation of DUT. The handler arm may obstruct external testing antenna setup. To avoid that, special and complex mechanical designs are required. In addition, since the RF instrumentation circuitry is disposed under the load board, long cables are needed to connect the testing antenna. The long cables obstruct the movement of the handler arm. The long cables and the long distance between the DUT antenna and the testing antenna lead to significant signal path loss, which limits the maximum stim power into DUT and lowers the testing coverage.

SUMMARY

It is one object of the present disclosure to provide an improved over-the-air (OTA) wireless test system with increased accuracy and performance.

According to one aspect of the present disclosure, a wireless test system includes a load board having an upper surface and a lower surface. The load board has a testing antenna disposed on the load board. A socket for receiving a device under test (DUT) having an antenna structure therein is disposed on the upper surface of the load board. The antenna structure is aligned with the testing antenna. The wireless test system further includes a handler for picking up and delivering the DUT to the socket. The handler has a clamp for holding and pressing the DUT. The clamp is grounded during testing and functions as a ground reflector that reflects and reverses radiation pattern of the DUT from an upward direction to a downward direction toward the testing antenna.

According to some embodiments, a radio-frequency (RF) instrumentation circuitry is disposed under the load board.

According to some embodiments, the load board is electrically connected to the RF instrumentation circuitry by a cable or a connector.

According to some embodiments, the testing antenna is electrically coupled to the RF instrumentation circuitry through the cable.

According to some embodiments, connection between the testing antenna and the RF instrumentation circuitry is implemented by wireless transmission.

According to some embodiments, an air-purge cover is disposed under the load board that defines an inner space filled with room-temperature dry air.

According to some embodiments, the RF instrumentation circuitry is disposed in the inner space.

According to some embodiments, the DUT comprises a packaged semiconductor die or an integrated circuit module that has therein an integrated mmW antenna structure.

According to some embodiments, the DUT comprises a system-on-chip (SoC), an antenna-in-package (AiP), a system-in-a-package (SiP), a package-on-package (PoP), or a module, which has at least one integrated RF die.

According to some embodiments, the clamp is a metal clamp.

According to some embodiments, the load board comprises a first connection pad and a second connection pad on the upper surface of the load board.

According to some embodiments, the socket comprises a plurality of first pogo pins for providing temporary conductive connection with the DUT and the first connection pad on the load board.

According to some embodiments, during testing, the DUT with its antenna structure facing upwardly to the clamp is held against the first pogo pins such that the plurality of first pogo pins is aligned with and electrically connected to respective contact points on a lower surface of the DUT.

According to some embodiments, at least some of the plurality of first pogo pins is disposed to surround the testing antenna so as to define a wave-guiding channel in the socket and directly above the testing antenna.

According to some embodiments, the wave-guiding channel is a through aperture in the socket.

According to some embodiments, the wireless test system further comprises a plurality of second pogo pins provided in a vertical wall portion of the socket.

According to some embodiments, a lower end of each of the plurality of second pogo pins is electrically connected to the second connection pad on the load board and an upper end of each of the plurality of second pogo pins is electrically connected to the clamp.

According to some embodiments, the second connection pad is a ground pad and the clamp is grounded through the second connection pad and the plurality of second pogo pins.

According to another aspect of the invention, a wireless test system includes a load board having an upper surface and a lower surface, a socket for receiving a device under test (DUT) having an antenna structure therein disposed on the upper surface of the load board, and a handler for picking up and delivering the DUT to the socket. The handler comprises a clamp for holding and pressing the DUT. A substrate with a testing circuit therein is embedded in the clamp.

According to some embodiments, the substrate is sandwiched by an upper portion and a lower portion of the clamp, and wherein the lower portion is situated between the substrate and a top surface of the DUT.

According to some embodiments, the testing circuit comprises a testing antenna, a detector, a transceiver, an up convert, or a down converter.

According to some embodiments, the load board comprises a first connection pad and a second connection pad on the upper surface of the load board.

According to some embodiments, the socket comprises a plurality of first pogo pins for providing temporary conductive connection with the DUT and the first connection pad on the load board.

According to some embodiments, during testing, the DUT with its antenna structure facing upwardly to the clamp is held against the first pogo pins such that the plurality of first pogo pins is aligned with and electrically connected to respective contact points on a lower surface of the DUT.

According to some embodiments, the wireless test system further comprises a plurality of second pogo pins provided in a vertical wall portion of the socket.

According to some embodiments, a lower end of each of the plurality of second pogo pins is electrically connected to the second connection pad on the load board and an upper end of each of the plurality of second pogo pins is electrically connected to the substrate.

According to still another aspect of the invention, a wireless test system includes a load board having an upper surface and a lower surface. The load board comprises a testing antenna disposed on the load board. A socket is disposed on the upper surface of the load board. A flipped device under test (DUT) having an antenna structure is installed in a cavity of the socket. The wireless test system further includes a handler for picking up and delivering the DUT to the socket. The handler comprises a clamp for holding and pressing the DUT. A substrate is embedded in the clamp.

According to some embodiments, the substrate is sandwiched by an upper portion and a lower portion of the clamp, and wherein the lower portion is situated between the substrate and the DUT.

According to some embodiments, the substrate is sandwiched by an upper portion and a lower portion of the clamp, and wherein the lower portion is situated between the substrate and the DUT.

According to some embodiments, the wireless test system further comprises a plurality of first pogo pins in the lower portion for providing temporary conductive connection with the DUT and the substrate.

According to some embodiments, the wireless test system further comprises a plurality of second pogo pins provided in a vertical wall portion of the socket.

According to some embodiments, a lower end of each of the plurality of second pogo pins is electrically connected to the second connection pad on the load board and an upper end of each of the plurality of second pogo pins is electrically connected to the substrate.

According to still another aspect of the invention, a wireless test system includes a load board having an upper surface and a lower surface. A socket for receiving a device under test (DUT) having an antenna structure therein is disposed on the upper surface of the load board. The wireless test system further includes a handler for picking up and delivering the DUT to the socket. The handler comprises a clamp for holding and pressing the DUT. A wave-guiding channel is disposed at least in the socket.

According to some embodiments, the wave-guiding channel is disposed in the clamp and in the socket.

According to some embodiments, the wave-guiding channel is disposed in the socket and in the load board.

According to some embodiments, the wave-guiding channel is disposed in the clamp, in the socket and in the load board.

According to some embodiments, the wireless test system further comprises an air-purge cover disposed under the load board that defines an inner space filled with room-temperature dry air.

According to some embodiments, the wireless test system further comprises a radio-frequency (RF) instrumentation circuitry disposed under the load board and within the inner spacer.

According to some embodiments, the wireless test system further comprises an adapter fixed on the lower surface of the load board, and the adapter is connected to RF instrumentation circuitry through a coaxial cable.

According to some embodiments, a distal end of the wave-guiding channel is aligned with the adapter.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
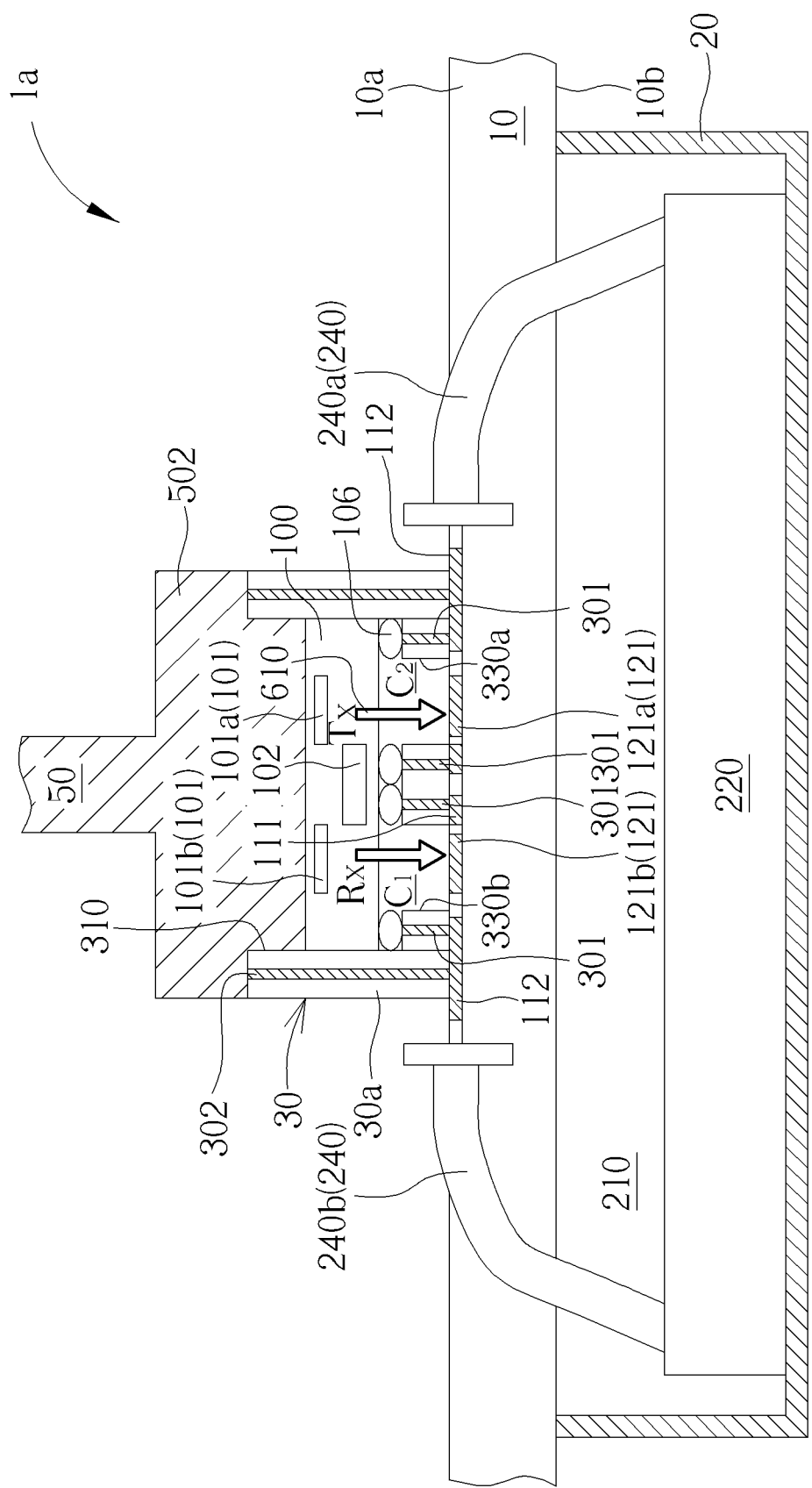
FIG. 1 is a schematic, cross-sectional diagram showing an exemplary OTA mmW test system for testing a DUT having an integrated mmW antenna structure in accordance with one embodiment of the invention.

In the following detailed description of embodiments of the invention, reference is made to the accompanying drawings, which form a part hereof, and in which is shown by way of illustration specific preferred embodiments in which the disclosure may be practiced. These embodiments are described in sufficient detail to enable those skilled in the art to practice them, and it is to be understood that other embodiments may be utilized and that mechanical, structural, and procedural changes may be made without departing from the spirit and scope of the present disclosure. The following detailed description is, therefore, not to be taken in a limiting sense, and the scope of embodiments of the present invention is defined only by the appended claims.

It will be understood that, although the terms first, second, third, primary, secondary, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first or primary element, component, region, layer or section discussed below could be termed a second or secondary element, component, region, layer or section without departing from the teachings of the present inventive concept.

Spatially relative terms, such as "beneath", "below", "lower", "under", "above," "upper," "over" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" or "over" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items, and may be abbreviated as "/".

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

It is noted that: (i) same features throughout the drawing figures will be denoted by the same reference label and are not necessarily described in detail in every drawing that they appear in, and (ii) a sequence of drawings may show different aspects of a single item, each aspect associated with various reference labels that may appear throughout the sequence, or may appear only in selected drawings of the sequence.

Wireless microelectronic devices usually undergo many kinds of tests in order to ensure sufficient performance and to verify their RF functionalities. Some tests are mandated by standards, while others are performed as part of product development and verification. A particular class of tests is that where the over-the-air (OTA) performance of the communication between one or several wireless transmitter and receivers is tested.

When a radio frequency signal is transmitted from a transmitter to a receiver, the signal propagates in a radio channel along one or more paths having different angles of arrivals, signal delays, polarizations and powers, which cause fading of different durations and strengths in the received signal. In addition, noise and interference due to other transmitters interfere with the radio connection.

The present disclosure pertains to wireless testing of semiconductor integrated circuit devices such as millimeter-wave (mmW) based antenna-in-package (AiP) devices. An improved OTA wireless test system or OTA mmW test system is provided to solve the shortcomings and drawbacks of the prior art wireless test systems. The present disclosure is particularly suited for OTA testing or radiated testing of an RF microelectronic or integrated circuit device under test (DUT) that has an integrated mmW antenna structure. The integrated antenna structure may have multiple elements in an array design that may be driven and/or sensed by integrated RF transmitter and/or receiver circuitry. The integrated antenna structure may operate or have a radiation pattern in the range 20 GHz to 300 GHz (millimeter wave frequencies). For example, the antenna structure may operate in a frequency band around 24 GHz, 60 GHz, 77 GHz, or 79 GHz, but is not limited thereto.

In a non-limiting example, the configuration depicted through the figures may be applicable to the wireless testing of a DUT or an AiP having a transmitter that may produce electromagnetic waves in the radio or microwaves domain, a transmitting antenna, a receiving antenna, a receiver, and a processor to determine properties of an object. For example, radio waves from the transmitter reflect off the object and return to the receiver, giving information about the object's location and speed.

FIG. 1 is a schematic, cross-sectional diagram showing an exemplary OTA wireless test system for testing a DUT that has an integrated mmW antenna structure in accordance with one embodiment of the invention. As shown in FIG. 1, the OTA wireless test system (hereinafter "wireless test system") 1a comprises a load board 10 such as a printed wiring board or a printed circuit board having an upper surface 10a and a lower surface 10b. The load board 10 may also be referred to as a test board, which typically comprises a core (e.g., FR4 copper clad laminate core), a plurality of dielectric build-up layers, and traces on opposite surfaces of the core. The traces in different levels of the printed circuit board are electrically connected to one another by plated through vias or plated through holes.

The load board 10 may be mechanically connected to an air-purge cover (or a housing) 20 so as to define an inner space 210 that may be filled with room-temperature dry air. According to one embodiment, an RF instrumentation circuitry 220 may be installed in the inner space 210, but is not limited thereto. According to one embodiment, the load board 10 may incorporate custom circuitry specific for testing a particular DUT 100. For example, the load board 10 may be a custom RF load board that has been modified especially for the radiative, electrical and physical characteristics of the particular DUT 100. According to one embodiment, for example, the load board 10 is electrically connected to the RF instrumentation circuitry 220 by RF cables and/or connectors. It is understood that the load board 10 may also be connected to DC power, ground, digital inputs/outputs, and/or a computer, which are not shown for the sake of simplicity.

According to one embodiment, the DUT 100 may be a packaged semiconductor die or an integrated circuit module that has therein an integrated mmW antenna structure (hereinafter "antenna structure") 101. The DUT 100 may be a system-on-chip (SoC), an antenna-in-package (AiP), a system-in-a-package (SiP), a package-on-package (PoP), or a module, which has at least one integrated radio frequency (RF) die 102. The RF die 102 may have on-chip RF transmitter and/or receiver circuitry that are associated with and coupled to the antenna structure 101.

According to one embodiment, a socket 30 is disposed on the upper surface 10a of the load board 10 to receive the DUT 100 that has been picked up and delivered to it by an automatic handler 50. According to one embodiment, the socket 30 (e.g., a custom test socket) may comprise a cavity 310 that receives and accommodates the DUT 100 and at least a lower portion of a clamp 502 of the handler 50 directly holding and pressing the DUT 100. According to one embodiment, the DUT 100 may be installed in the socket 30 by the automated handler 50 that can pick up the DUT 100 and place it on the socket 30. In some embodiments, the automated handler 50 may grip or hold the combination of the DUT 100 and the socket 30 and may install them on the load board 10.

Once the DUT 100 has been installed in the socket 30, its power and signal pins are conductively coupled to a DUT side of the RF instrumentation circuitry 220. A computer (not shown) is connected to a tester side of the RF instrumentation circuitry 220. The computer then runs software to conduct a test procedure in which the RF instrumentation circuitry 220 is commanded to stimulate the DUT 100 and capture the DUT's RF output response, which are then stored in digital form.

According to one embodiment, the clamp 502 may be composed of metal or metal alloy. The socket 30 is used to electrically connect metallic wires or contact pads of the load board 10 with contact points 106 of the DUT 100. For example, the socket 30 comprises a plurality of pogo pins 301 for providing temporary conductive connection with the DUT 100 and the connection pads 111 on the load board 10. During testing, the DUT 100 with its antenna structures 101a and 101b facing upwardly to the clamp 502 is held against the pogo pins 301 such that these pogo pins 301 are aligned with and electrically connected to respective contact points 106 on a lower surface of the DUT 100. According to one embodiment, a plurality of pogo pins 302 is provided in the vertical wall portion 30a of the socket 30. One end (the lower end) of each of the pogo pins 302 is electrically connected to a connection pad 112 on the load board 10. The other end (the upper end) of each of the pogo pins 302 is electrically connected to the clamp 502.

According to one embodiment, the load board 10 further comprises at least a testing antenna 121. In FIG. 1, two testing antennas 121a and 121b corresponding to RF transmit ($T_x$) and RF receive ($R_x$) signals are shown for the purpose of illustration. According to one embodiment, the connection pad 112 and the testing antenna 121 may be fabricated in the top metal layer of the load board 10, but is not limited thereto. In some embodiments, the connection pad 112 and the testing antenna 121 may be fabricated in the inner metal layer or in the bottom metal layer of the load board 10. According to one embodiment, the two testing antennas 121a and 121b may be electrically coupled to the RF instrumentation circuitry 220 through the cables 240a and 240b, respectively. In some embodiments, the connection between the testing antenna 121 and the RF instrumentation circuitry 220 may be implemented by wireless transmission instead of cables 240.

According to one embodiment, the connection pad 112 may be a ground pad and the clamp 502 may be grounded during testing. By providing such configuration, the metal clamp 502 may function as a ground reflector that reflects and reverses the radiation pattern of the DUT 100 from the upward direction to the downward direction (as indicated by arrows 610).

According to one embodiment of the invention, the pogo pins 301 and 302 may be composed of metal materials, such as copper, but is not limited thereto. According to one embodiment, at least some of the pogo pins 301 may be designed to surround each of the two testing antennas 121a and 121b so as to define wave-guiding channels $C_1$ and $C_2$ directly above the two testing antennas 121a and 121b, respectively, in the socket 30. According to one embodiment, the wave-guiding channels $C_1$ and $C_2$ are two through openings or through apertures 330a and 330b in the socket 30. The through apertures 330a and 330b are surrounded by at least some of the pogo pins 301 for reducing path loss between the DUT 100 and the testing antenna 121. Therefore, the antenna structure 101 is corresponding to the testing antenna 121. In other embodiment, the antenna structure 101 is aligned with the testing antenna 121.

Figure 2:
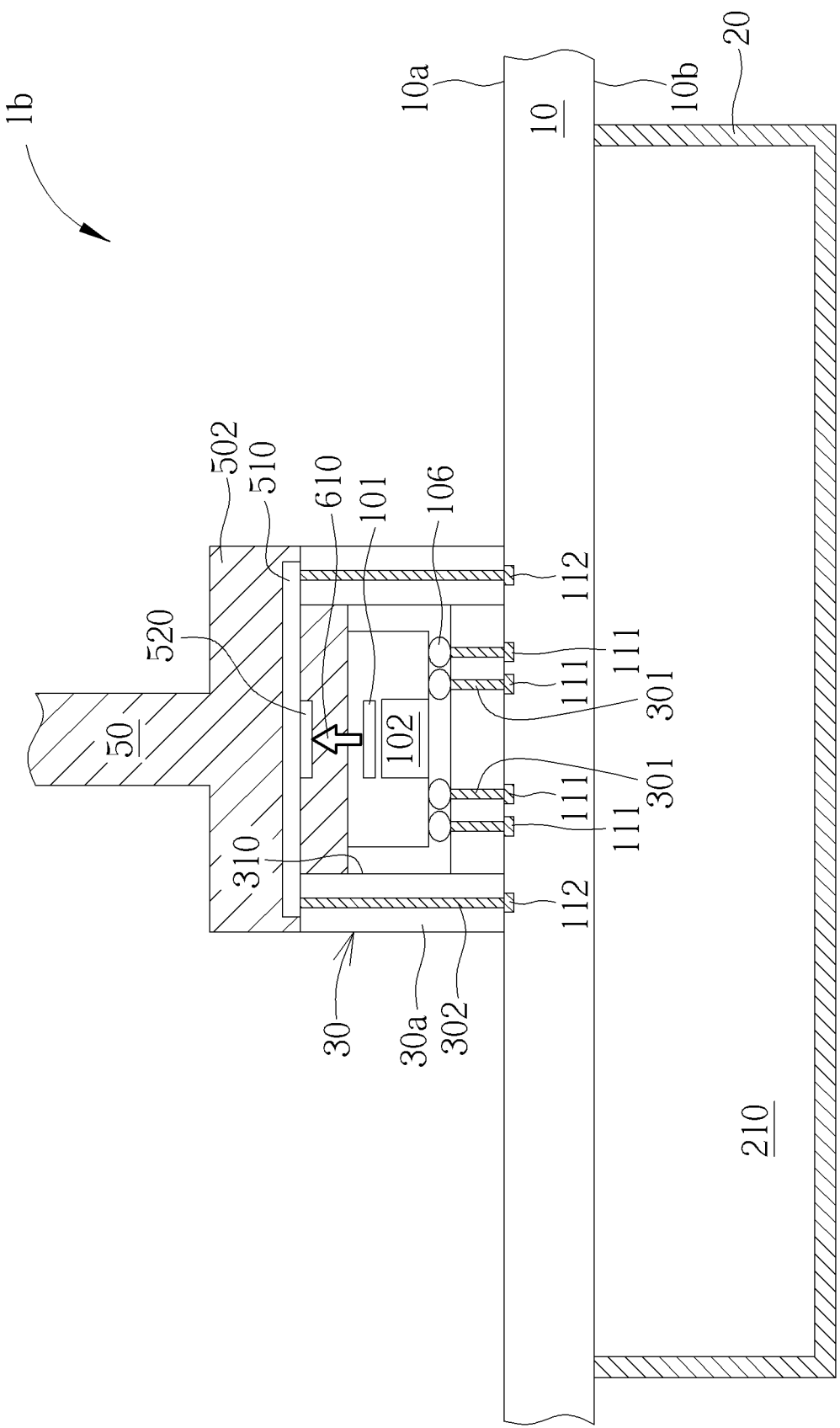
FIG. 2 is a schematic, cross-sectional diagram showing a wireless test system for testing a DUT having an integrated mmW antenna structure in accordance with another embodiment of the invention.

FIG. 2 is a schematic, cross-sectional diagram showing a wireless test system for testing a DUT that has an integrated mmW antenna structure in accordance with another embodiment of the invention. As shown in FIG. 2, likewise, the wireless test system 1b comprises a load board 10 such as a printed wiring board or a printed circuit board having an upper surface 10a and a lower surface 10b. The load board 10 typically comprises a core (e.g., FR4 copper clad laminate core), a plurality of dielectric build-up layers, and traces on opposite surfaces of the core. The traces in different levels of the printed circuit board are electrically connected to one another by plated through vias or plated through holes.

The load board 10 may be mechanically connected to an air-purge cover or a housing 20 so as to define an inner space 210 that may be filled with room-temperature dry air. According to one embodiment, the load board 10 may incorporate custom circuitry specific for testing a particular DUT 100. For example, the load board 10 may be a custom RF load board that has been modified especially for the radiative, electrical and physical characteristics of the particular DUT 100. It is understood that the load board 10 may also be connected to DC power, ground, digital inputs/outputs, and/or a computer, which are not shown for the sake of simplicity.

According to one embodiment, the DUT 100 may be a packaged semiconductor die or an integrated circuit module that has therein an integrated mmW antenna structure 101. The DUT 100 may be a system-on-chip (SoC), an antenna-in-package (AiP), a system-in-a-package (SiP), a package-on-package (PoP), or a module, which has at least one integrated RF die 102. The RF die 102 may have on-chip RF transmitter and/or receiver circuitry that are associated with and coupled to the antenna structure 101.

According to one embodiment, a socket 30 is disposed on the upper surface 10a of the load board 10 to receive the DUT 100 that has been picked up and delivered to it by an automatic handler 50. According to one embodiment, the socket 30 (e.g., a custom test socket) may comprise a cavity 310 that receives and accommodates the DUT 100 and at least a lower portion of a clamp 502 of the handler 50 directly holding and pressing the DUT 100. According to one embodiment, the DUT 100 may be installed in the socket 30 by the automated handler 50 that can pick up the DUT 100 and place it on the socket 30. In some embodiments, the automated handler 50 may grip or hold the combination of the DUT 100 and the socket 30 and may install them on the load board 10.

According to one embodiment, a substrate 510 with testing circuit 520 therein is embedded in the clamp 502. According to one embodiment, the substrate 510 may be sandwiched by an upper portion 502a and a lower portion 502b of the clamp 502. According to one embodiment, the upper portion 502a of the clamp 502 may be composed of metal or metal alloy. According to one embodiment, the lower portion 502b of the clamp 502 may be composed of non-metal materials that allow RF signals to pass therethrough. The lower portion 502b and the DUT 100 are disposed in the cavity 310 of the socket 30.

According to one embodiment, the substrate 510 may be a printed wiring board or a printed circuit board, but is not limited thereto. According to one embodiment, the testing circuit 520 may comprise a testing antenna, a detector, a transceiver, an up convert, a down converter, which is able to translate signals between mmW and non-mmW. For example, the testing circuit 520 may be a testing antenna that is corresponding to the underlying antenna structure 101. In other embodiment, the antenna structure 101 is aligned with the testing antenna 121. The upward direction of the radiated mmW is indicated by arrows 610.

The socket 30 is used to electrically connect metallic wires or contact pads of the load board 10 with contact points 106 of the DUT 100. For example, the socket 30 comprises a plurality of pogo pins 301 for providing temporary conductive connection with the DUT 100 and the connection pads 111 on the load board 10. During testing, the DUT 100 with its antenna structure 101 facing upwardly to the clamp 502 is held against the pogo pins 301 such that these pogo pins 301 are aligned with and electrically connected to respective contact points 106 on a lower surface of the DUT 100. According to one embodiment, a plurality of pogo pins 302 is provided in the vertical wall portion 30a of the socket 30. One end (the lower end) of each of the pogo pins 302 is electrically connected to a connection pad 112 on the load board 10. The other end (the upper end) of each of the pogo pins 302 is electrically connected to the substrate 510.

Figure 3:
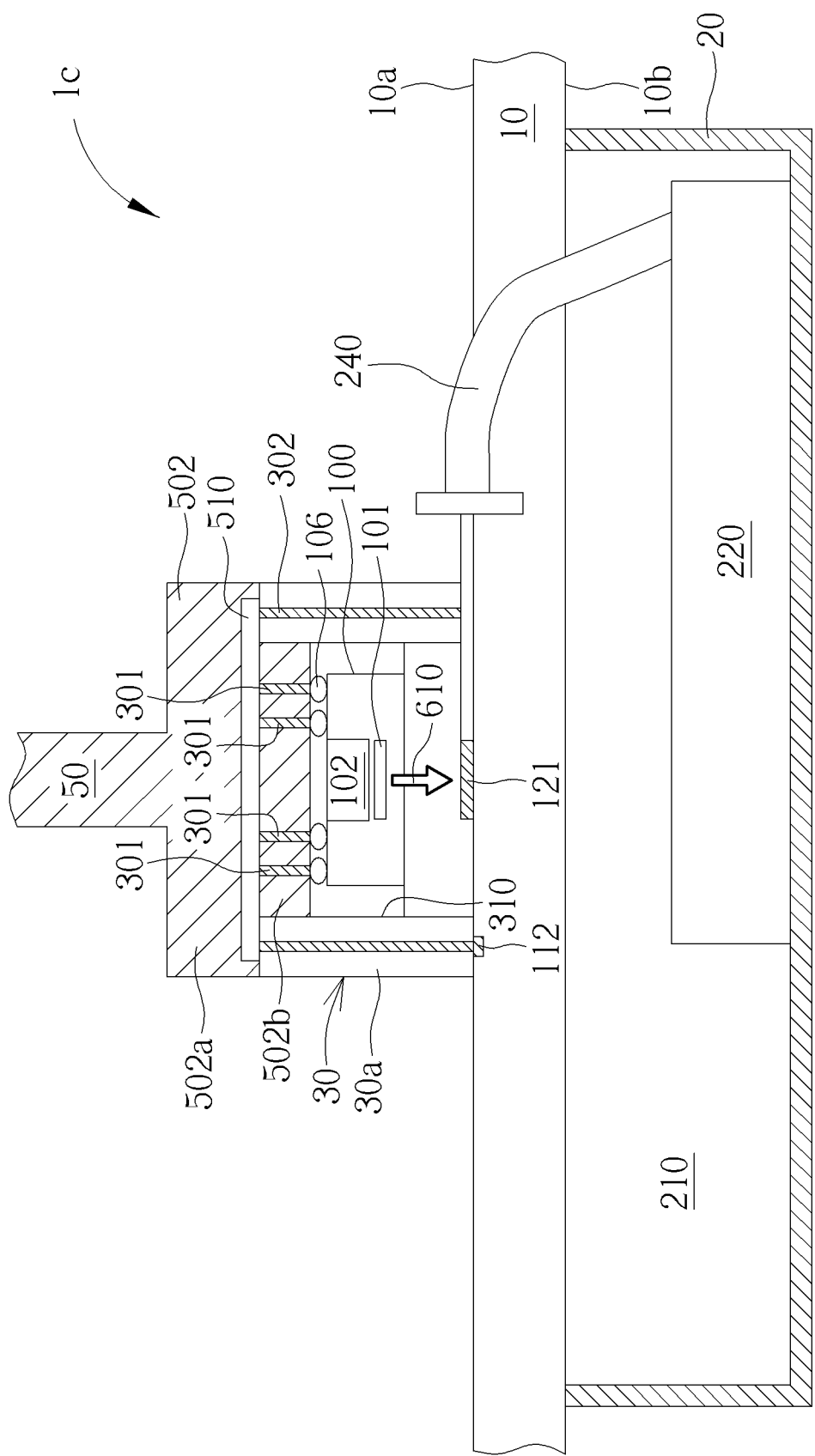
FIG. 3 is a schematic, cross-sectional diagram showing a wireless test system for testing a DUT having an integrated mmW antenna structure in accordance with still another embodiment of the invention.

FIG. 3 is a schematic, cross-sectional diagram showing a wireless test system for testing a DUT that has an integrated mmW antenna structure in accordance with still another embodiment of the invention. As shown in FIG. 3, likewise, the wireless test system 1c comprises a load board 10 such as a printed wiring board or a printed circuit board having an upper surface 10a and a lower surface 10b. The load board 10 typically comprises a core (e.g., FR4 copper clad laminate core), a plurality of dielectric build-up layers, and traces on opposite surfaces of the core. The traces in different levels of the printed circuit board are electrically connected to one another by plated through vias or plated through holes.

The load board 10 may be mechanically connected to an air-purge cover or a housing 20 so as to define an inner space 210 that may be filled with room-temperature dry air. According to one embodiment, an RF instrumentation circuitry 220 may be installed in the inner space 210, but is not limited thereto. According to one embodiment, the load board 10 may incorporate custom circuitry specific for testing a particular DUT 100. For example, the load board 10 may be a custom RF load board that has been modified especially for the radiative, electrical and physical characteristics of the particular DUT 100. It is understood that the load board 10 may also be connected to DC power, ground, digital inputs/outputs, and/or a computer, which are not shown for the sake of simplicity.

According to one embodiment, the DUT 100 may be a packaged semiconductor die or an integrated circuit module that has therein an integrated mmW antenna structure 101. The DUT 100 may be a system-on-chip (SoC), an antenna-in-package (AiP), a system-in-a-package (SiP), a package-on-package (PoP), or a module, which has at least one integrated RF die 102. The RF die 102 may have on-chip RF transmitter and/or receiver circuitry that are associated with and coupled to the antenna structure 101.

According to one embodiment, a socket 30 is disposed on the upper surface 10a of the load board 10 to receive a flipped DUT 100 that has been picked up and delivered to it by an automatic handler 50. According to one embodiment, the socket 30 (e.g., a custom test socket) may comprise a cavity 310 that receives and accommodates the flipped DUT 100 and at least a lower portion 502b of the clamp 502 directly pressing the DUT 100. According to one embodiment, the DUT 100 may be installed in the socket 30 by the automated handler 50 that can pick up the DUT 100 and place it on the socket 30. In some embodiments, the automated handler 50 may grip or hold the combination of the DUT 100 and the socket 30 and may install them on the load board 10.

According to one embodiment, a substrate 510 with interconnect circuit therein is embedded in the clamp 502. According to one embodiment, the substrate 510 may be sandwiched by an upper portion 502a and a lower portion 502b of the clamp 502. According to one embodiment, the upper portion 502a of the clamp 502 may be composed of metal, metal alloy, or non-metal materials. According to one embodiment, the lower portion 502b of the clamp 502 may be composed of metal, metal alloy, or non-metal materials. The lower portion 502b and the DUT 100 are disposed in the cavity 310 of the socket 30.

According to one embodiment, the substrate 510 may be a printed wiring board or a printed circuit board, but is not limited thereto. According to one embodiment, the substrate 510 is electrically connected to the contact points 106 of the flipped DUT 100 through the pogo pins 301 provided in the lower portion 502b of the clamp 502. According to one embodiment, the substrate 510 is electrically connected to the load board 10 through the pogo pins 302 provided in the vertical wall portion 30a of the socket 30. Power and/or control signals from the load board 10 may be provide to the substrate 510 through the pogo pins 302.

According to one embodiment, the load board 10 further comprises at least a testing antenna 121. According to one embodiment, the connection pad 112 and the testing antenna 121 may be fabricated in the top metal layer of the load board 10, but is not limited thereto. In some embodiments, the connection pad 112 and the testing antenna 121 may be fabricated in the inner metal layer or in the bottom metal layer of the load board 10. According to one embodiment, the testing antenna 121 may be electrically coupled to the RF instrumentation circuitry 220 through the cable 240. In some embodiments, the connection between the testing antenna 121 and the RF instrumentation circuitry 220 may be implemented by wireless transmission.

Once the flipped DUT 100 has been installed in the socket 30, its power and signal pins are conductively coupled to a DUT side of the RF instrumentation circuitry 220. A computer (not shown) is connected to a tester side of the RF instrumentation circuitry 220. The computer then runs software to conduct a test procedure in which the RF instrumentation circuitry 220 is commanded to stimulate the DUT 100 and capture the DUT's RF output response, which are then stored in digital form. The downward direction of the radiated mmW is indicated by arrows 610. Since the DUT 100 is flipped when installing in the socket 30, the distance between the antenna structure 101 and the testing antenna 121 is reduced. Therefore, the path loss can be minimized and the testing coverage is higher.

Figure 4:
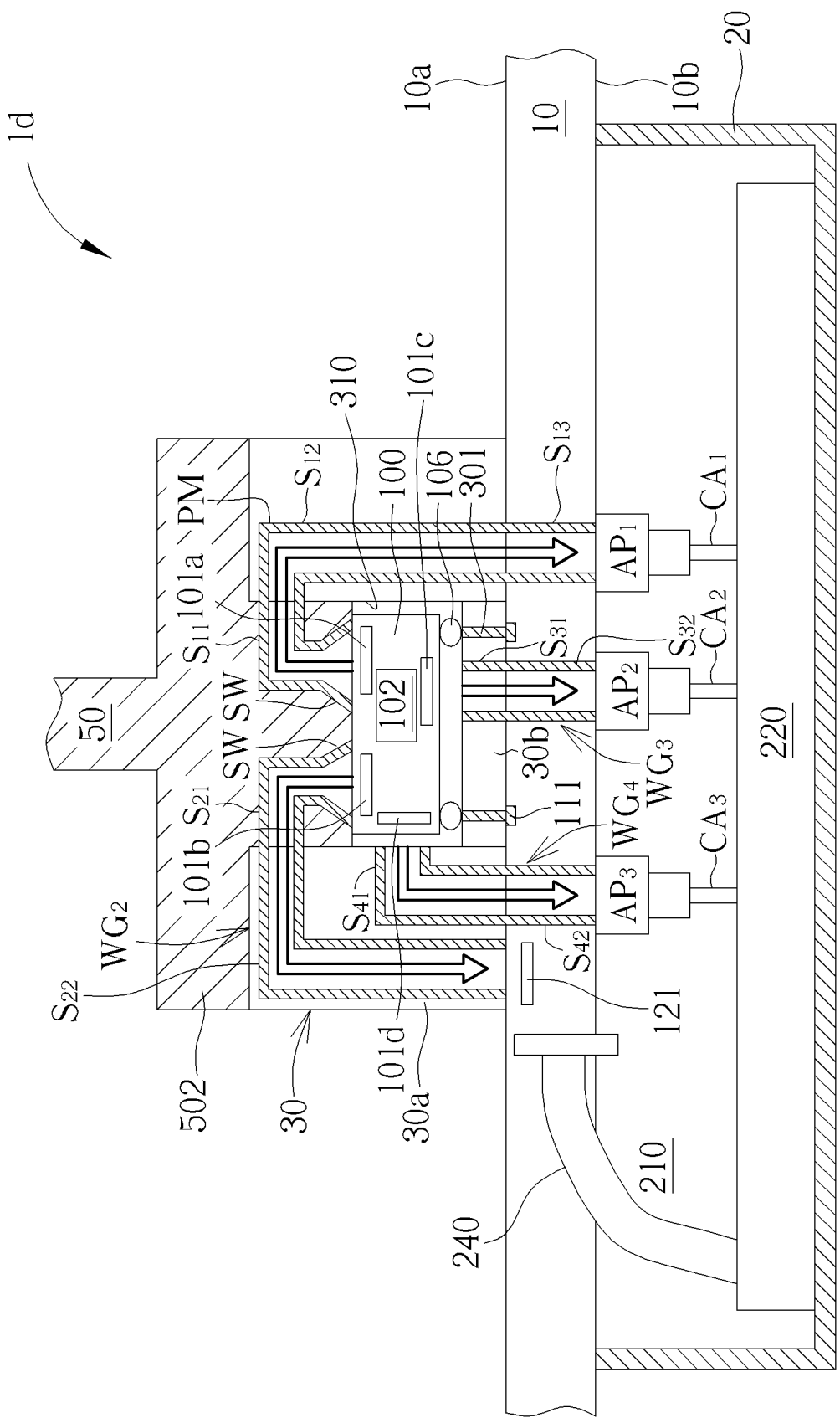
FIG. 4 is a schematic, cross-sectional diagram showing a wireless test system for testing a DUT having an integrated mmW antenna structure in accordance with yet another embodiment of the invention.

FIG. 4 is a schematic, cross-sectional diagram showing a wireless test system for testing a DUT that has an integrated mmW antenna structure in accordance with yet another embodiment of the invention. As shown in FIG. 4, likewise, the wireless test system 1d comprises a load board 10 such as a printed wiring board or a printed circuit board having an upper surface 10a and a lower surface 10b. The load board 10 typically comprises a core (e.g., FR4 copper clad laminate core), a plurality of dielectric build-up layers, and traces on opposite surfaces of the core. The traces in different levels of the printed circuit board are electrically connected to one another by plated through vias or plated through holes.

The load board 10 may be mechanically connected to an air-purge cover or a housing 20 so as to define an inner space 210 that may be filled with room-temperature dry air. According to one embodiment, an RF instrumentation circuitry 220 may be installed in the inner space 210, but is not limited thereto. According to one embodiment, the load board 10 may incorporate custom circuitry specific for testing a particular DUT 100. For example, the load board 10 may be a custom RF load board that has been modified especially for the radiative, electrical and physical characteristics of the particular DUT 100. According to one embodiment, for example, the load board 10 is electrically connected to the RF instrumentation circuitry 220 by RF cables and/or connectors. It is understood that the load board 10 may also be connected to DC power, ground, digital inputs/outputs, and/or a computer, which are not shown for the sake of simplicity.

According to one embodiment, the DUT 100 may be a packaged semiconductor die or an integrated circuit module that has therein at least one integrated mmW antenna structure 101. The DUT 100 may be a system-on-chip (SoC), an antenna-in-package (AiP), a system-in-a-package (SiP), a package-on-package (PoP), or a module, which has at least one integrated RF die 102. The RF die 102 may have on-chip RF transmitter and/or receiver circuitry that are associated with and coupled to the antenna structure 101.

According to one embodiment, a socket 30 is disposed on the upper surface 10a of the load board 10 to receive the DUT 100 that has been picked up and delivered to it by an automatic handler 50. According to one embodiment, the socket 30 (e.g., a custom test socket) may comprise a cavity 310 that receives and accommodates the DUT 100 and at least a lower portion of a clamp 502 of the handler 50 directly holding and pressing the DUT 100. According to one embodiment, the DUT 100 may be installed in the socket 30 by the automated handler 50 that can pick up the DUT 100 and place it on the socket 30. In some embodiments, the automated handler 50 may grip or hold the combination of the DUT 100 and the socket 30 and may install them on the load board 10.

According to one embodiment, the clamp 502 may be composed of metal, metal alloy, or non-metal materials. According to one embodiment, the socket 30 may be composed of phenol formaldehyde resin (or Bakelite) or Teflon, but is not limited thereto. The socket 30 is used to electrically connect metallic wires or contact pads of the load board 10 with contact points 106 of the DUT 100. For example, the socket 30 comprises a plurality of pogo pins 301 for providing temporary conductive connection with the DUT 100 and the connection pads 111 on the load board 10. During testing, the DUT 100 is held against the pogo pins 301 such that these pogo pins 301 are aligned with and electrically connected to respective contact points 106 on a lower surface of the DUT 100.

According to one embodiment, at least one waveguide channel is provided in the clamp 502 and in the socket 30 for guiding the radiated RF signals to the load board 10. For example, four waveguide channels $WG_1$, $WG_2$, $WG_3$ and $WG_4$ are illustrated in FIG. 4. The four exemplary waveguide channels $WG_1$, $WG_2$, $WG_3$ and $WG_4$ correspond to the four antenna structures 101a~101d of the DUT 100, respectively. It is to be understood that the four antenna structures 101a~101d of the DUT 100 are shown in FIG. 4 for illustration purposes only. It is to be understood that the four antenna structures 101a~101d are demonstrated to explain that various waveguide channel structures may be used in accordance with different orientations, locations, or arrangement of the antenna structures 101a~101d.

It is to be understood that the shapes and dimensions of the waveguide channels $WG_1$, $WG_2$, $WG_3$ and $WG_4$ may be changed according to various design requirements. For example, one end of the waveguide channel, which is in proximity to the antenna structure in the DUT, may have a horn shape sectional profile. Such horn-shaped end structure is also shown in FIG. 4. In FIG. 4, the distal ends, which are in proximity to the antenna structure in the DUT, of the waveguide channels $WG_1$ and $WG_2$ are horn-shaped.

According to one embodiment, for example, the other distal end of the waveguide channel $WG_1$ is aligned with an adapter $AP_1$ that is fixed on the lower surface 10b of the load board 10. The adapter $AP_1$ may be connected to a coaxial cable $CA_1$. Through the adapter $AP_1$ and the coaxial cable $CA_1$, the guided mmW signals or RF signals may be transmitted to the RF instrumentation circuitry 220. According to one embodiment, for example, the other distal end of the waveguide channel $WG_2$ may be aligned with a testing antenna 121. The testing antenna 121 may be electrically coupled to the RF instrumentation circuitry 220 through the cable 240. Alternatively, the connection between the testing antenna 121 and the RF instrumentation circuitry 220 may be implemented by wireless transmission instead of cables 240.

According to one embodiment, for example, the waveguide channel $WG_1$ comprises three sections: $S_{11}$, $S_{12}$ an $S_{13}$. The section $S_{11}$ is disposed in the clamp 502. The section $S_{12}$ is disposed in the socket 30. The section $S_{13}$ is disposed in the load board 10. According to one embodiment, for example, the section $S_{11}$ and the section $S_{12}$ are hollow, through holes with their interior walls plated with a metal layer PM. The section $S_{13}$ in the load board 10 is not a hollow, through hole. The section $S_{13}$ in the load board 10 is a channel defined by a metal wall MW extending through the entire thickness of the load board 10. The channel of the section $S_{13}$ may be completely filled with dielectric materials of the load board 10. According to one embodiment, no metal wiring layer is formed in the channel in order to not obstruct the transmission of the mmW signals or RF signals.

According to one embodiment, for example, the waveguide channel $WG_2$ comprises two sections: $S_{21}$ and $S_{22}$. The section $S_{21}$ is disposed in the clamp 502. The section $S_{22}$ is disposed in the socket 30. According to one embodiment, the section $S_{12}$ of the waveguide channel $WG_1$ and the section $S_{22}$ of the waveguide channel $WG_2$ are disposed in the vertical wall portions 30a of the socket 30. According to one embodiment, for example, the waveguide channel $WG_3$ comprises two sections: $S_{31}$ and $S_{32}$. The section $S_{31}$ is disposed in a base portion 30b of the socket 30. The section $S_{32}$ is disposed in the load board 10. According to one embodiment, for example, the waveguide channel $WG_4$ comprises two sections: $S_{41}$ and $S_{42}$. The section $S_{41}$ is disposed in the vertical wall portions 30a of the socket 30. The section $S_{42}$ is disposed in the load board 10. The section $S_{32}$ and the section $S_{42}$ have a structure that is similar to the section $S_{13}$. The section $S_{32}$ and the section $S_{42}$ are aligned with adapters $AP_2$ and $AP_3$, respectively. The adapters $AP_2$ and $AP_3$ are fixed on the lower surface 10b of the load board 10. The adapter $AP_2$ may be connected to a coaxial cable $CA_2$. The adapter $AP_2$ may be connected to a coaxial cable $CA_3$.

It is advantageous to use the present disclosure because no cables pass through the load board 10 and no hollow holes are formed in the load board 10. The moisture isolation is greatly improved during low-temperature testing.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A wireless test system, comprising:
a load board having an upper surface and a lower surface, wherein the load board comprises a testing antenna disposed on the load board;
a socket for receiving a device under test (DUT) having an antenna structure therein, disposed on the upper surface of the load board, wherein the antenna structure is corresponding to the testing antenna; and
a handler for picking up and delivering the DUT to the socket, wherein the handler comprises a clamp for holding and pressing the DUT, and wherein the clamp is grounded during testing and functions as a ground reflector that reflects and reverses radiation pattern of the DUT from an upward direction to a downward direction toward the testing antenna.

2. The wireless test system according to claim 1, wherein a radio-frequency (RF) instrumentation circuitry is disposed under the load board.

3. The wireless test system according to claim 2, wherein the load board is electrically connected to the RF instrumentation circuitry by a cable or a connector.

4. The wireless test system according to claim 3, wherein the testing antenna is electrically coupled to the RF instrumentation circuitry through the cable.

5. The wireless test system according to claim 2, wherein connection between the testing antenna and the RF instrumentation circuitry is implemented by wireless transmission.

6. The wireless test system according to claim 2, wherein an air-purge cover is disposed under the load board that defines an inner space filled with room-temperature dry air.

7. The wireless test system according to claim 1, wherein the DUT comprises a packaged semiconductor die or an integrated circuit module that has therein an integrated mmW antenna structure.

8. The wireless test system according to claim 1, wherein the DUT comprises a system-on-chip (SoC), an antenna-in-package (AiP), a system-in-a-package (SiP), a package-on-package (PoP), or a module, which has at least one integrated RF die.

9. The wireless test system according to claim 1, wherein the socket comprises a plurality of first pogo pins for providing temporary conductive connection with the DUT and a first connection pad on the load board.

10. The wireless test system according to claim 9, wherein, during testing, the DUT with its antenna structure facing upwardly to the clamp is held against the first pogo pins such that the plurality of first pogo pins is aligned with and electrically connected to respective contact points on a lower surface of the DUT.

11. The wireless test system according to claim 10, wherein at least some of the plurality of first pogo pins is disposed to surround the testing antenna so as to define a wave-guiding channel in the socket and directly above the testing antenna.

12. The wireless test system according to claim 11 further comprising:
a plurality of second pogo pins provided in a vertical wall portion of the socket.

13. A wireless test system, comprising:
a load board having an upper surface and a lower surface;
a socket for receiving a device under test (DUT) having an antenna structure therein, disposed on the upper surface of the load board;
a handler for picking up and delivering the DUT to the socket, wherein the handler comprises a clamp for holding and pressing the DUT; and
a substrate with a testing circuit therein, wherein the substrate is embedded in the clamp.

14. The wireless test system according to claim 13, wherein the substrate is sandwiched by an upper portion and a lower portion of the clamp, and wherein the lower portion is situated between the substrate and a top surface of the DUT.

15. The wireless test system according to claim 14, wherein the testing circuit comprises a testing antenna, a detector, a transceiver, an up convert, or a down converter.

16. A wireless test system, comprising:
a load board having an upper surface and a lower surface, wherein the load board comprises a testing antenna disposed on the load board;
a socket disposed on the upper surface of the load board;
a flipped device under test (DUT) having an antenna structure installed in a cavity of the socket;
a handler for picking up and delivering the DUT to the socket, wherein the handler comprises a clamp for holding and pressing the DUT; and
a substrate embedded in the clamp.

17. The wireless test system according to claim 16, wherein the substrate is sandwiched by an upper portion and a lower portion of the clamp, and wherein the lower portion is situated between the substrate and the DUT.

18. The wireless test system according to claim 17, wherein the substrate is sandwiched by an upper portion and a lower portion of the clamp, and wherein the lower portion is situated between the substrate and the DUT.

19. A wireless test system, comprising:
a load board having an upper surface and a lower surface;

a socket for receiving a device under test (DUT) having an antenna structure therein, disposed on the upper surface of the load board;

a handler for picking up and delivering the DUT to the socket, wherein the handler comprises a clamp for holding and pressing the DUT; and a wave-guiding channel disposed at least in the socket.

20. The wireless test system according to claim 19, wherein the wave-guiding channel is disposed in the clamp and in the socket.

21. The wireless test system according to claim 19, wherein the wave-guiding channel is disposed in the socket and in the load board.

22. The wireless test system according to claim 19, wherein the wave-guiding channel is disposed in the clamp, in the socket and in the load board.

23. The wireless test system according to claim 19 further comprising:

an air-purge cover disposed under the load board that defines an inner space filled with room-temperature dry air.

24. The wireless test system according to claim 19 further comprising:

an adapter fixed on the lower surface of the load board, and the adapter is connected to RF instrumentation circuitry through a coaxial cable, wherein a distal end of the wave-guiding channel is aligned with the adapter.

\* \* \* \* \*